US012601765B2

(12) United States Patent
Mugishima et al.

(10) Patent No.: US 12,601,765 B2
(45) Date of Patent: Apr. 14, 2026

(54) CURRENT SENSOR

(71) Applicant: Suncall Corporation, Kyoto (JP)

(72) Inventors: Akio Mugishima, Kyoto (JP); Kenji Murakami, Kyoto (JP)

(73) Assignee: Suncall Corporation, Kyoto (JP)

( * ) Notice: Subject to any disclaimer, the term of this patent is extended or adjusted under 35 U.S.C. 154(b) by 179 days.

(21) Appl. No.: 18/455,548

(22) Filed: Aug. 24, 2023

(65) Prior Publication Data

US 2024/0012032 A1 Jan. 11, 2024

Related U.S. Application Data

(63) Continuation of application No. PCT/JP2022/000163, filed on Jan. 6, 2022.

(30) Foreign Application Priority Data

Feb. 24, 2021 (JP) ................................. 2021-027016

(51) Int. Cl.
  G01R 15/20 (2006.01)
  G01R 19/00 (2006.01)
(52) U.S. Cl.
  CPC ......... G01R 15/20 (2013.01); G01R 19/0092 (2013.01)
(58) Field of Classification Search
  CPC ...... G01R 15/20; G01R 15/207; G01R 19/00; G01R 19/0092
  See application file for complete search history.

(56) References Cited

U.S. PATENT DOCUMENTS

| | | | | |
|---|---|---|---|---|
| 9,465,054 B2 * | 10/2016 | Sakamoto | .............. | G01R 19/00 |
| 10,627,428 B2 * | 4/2020 | Sei | .......... | G01R 33/07 |
| 2009/0078043 A1 * | 3/2009 | Tsuda | .................. | B29C 45/1671 |
| | | | | 73/431 |
| 2010/0156394 A1 * | 6/2010 | Ausserlechner | ..... | G01R 15/202 |
| | | | | 324/144 |
| 2010/0259255 A1 * | 10/2010 | Hashio | ................. | G01R 15/207 |
| | | | | 324/244 |
| 2011/0148407 A1 * | 6/2011 | Kawaguchi | .......... | G01R 15/207 |
| | | | | 324/244 |
| 2013/0136974 A1 * | 5/2013 | Lim | .................... | H01M 50/574 |
| | | | | 429/157 |
| 2015/0204919 A1 * | 7/2015 | Akimoto | .............. | G01R 15/207 |
| | | | | 324/244 |
| 2019/0154735 A1 * | 5/2019 | Shimizu | ................. | G01R 19/32 |
| 2019/0178917 A1 * | 6/2019 | Shimizu | ............. | G01R 19/0092 |

(Continued)

FOREIGN PATENT DOCUMENTS

| | | |
|---|---|---|
| CN | 101640397 A | 2/2010 |
| CN | 210894464 U | 6/2020 |

(Continued)

*Primary Examiner* — Dominic E Hawkins
(74) *Attorney, Agent, or Firm* — Farber LLC

(57) ABSTRACT

A current sensor that can reduce an installation area and improve measurement accuracy has a busbar through which current to be measured flows and a magnetic sensor that detects a magnetic field component generated by the current flowing through the busbar. The busbar can have left and right through-holes which can change the flow of the current to be measured. The magnetic sensor can be mounted on the upper surface of the busbar and can be screw-fixed to the upper surface of the busbar using the left and right through-holes.

1 Claim, 8 Drawing Sheets

(56)  References Cited

U.S. PATENT DOCUMENTS

| | | | |
|---|---|---|---|
| 2019/0187187 A1 | 6/2019 | Umetsu et al. | |
| 2020/0256895 A1* | 8/2020 | Okuyama ............ | G01R 15/148 |
| 2022/0276308 A1* | 9/2022 | Kawaguchi ......... | H01R 11/283 |

FOREIGN PATENT DOCUMENTS

| | | | | |
|---|---|---|---|---|
| JP | 2001059851 | A | | 3/2001 |
| JP | 2010014477 | A | | 1/2010 |
| JP | 2010223868 | A | * | 10/2010 |
| JP | 2012141262 | A | * | 7/2012 |
| JP | 2013053914 | A | | 3/2013 |
| JP | 2013113631 | A | | 6/2013 |
| WO | 2019220766 | A1 | | 11/2019 |

* cited by examiner

PRIOR ART

1

CURRENT SENSOR

FIELD OF THE INVENTION

The present invention relates to a current sensor.

BACKGROUND OF THE INVENTION

A conventional current sensor is described in Japanese Patent Application Publication No. 2010-14477. As shown in FIG. 7, a conventional current sensor 100 comprises a bus bar 101 through which a current I (see FIG. 8(*a*)) to be measured flows, and a magnetic sensor 102 arranged at a position separated from the bus bar 101 in a vertical m direction with respect to the bus bar 101. The magnetic sensor can detect a magnetic field component M generated in a direction perpendicular to the current flowing through the bus bar 101. Circular bolt holes denoted by 101a are for passing shaft of bolts (not shown).

SUMMARY OF THE INVENTION

The magnetic sensor 102 set forth above has large variations in sensitivity in product performance, so it is necessary to adjust the magnetic sensor 102 in the vertical upward direction or the vertical downward direction in order to adjust the detection sensitivity when the magnetic sensor 102 detects the magnetic field component M. That is, as shown in FIG. 8(*a*), when the current I to be measured flows through the bus bar 101, the magnetic field component M is generated in a direction perpendicular to the current I as shown in FIG. 7. In this case, it can be seen from the measurement result of a magnetic flux density shown in FIG. 8(*b*) that a homogeneous M is generated at any surfaces of the magnetic sensor 102. Therefore, the location where the variations of intensity of the magnetic field component M occur are only in the vertical upward direction or the vertical downward direction with respect to the bus bar 101 (when the magnetic sensor 102 approaches the bus bar 101, the magnetic field component M becomes stronger, and when the magnetic sensor 102 is separated from the bus bar 101, the magnetic field component M becomes weaker). Therefore, it was necessary to adjust the magnetic sensor 102 vertically upward or vertically downward in order to adjust the sensitivity of the detection. Incidentally, adjusting the sensitivity of the detection means, for example, adjusting the magnetic sensor 102 so that a voltage of 1V can be detected when the current I of 100A flows through the bus bar 101.

As aforementioned, when the magnetic sensor 102 is adjusted in the vertical upward direction or the vertical downward direction with respect to the bus bar 101, there has been a problem that the installation area of the current sensor 100 increases. Further, because the magnetic sensor 102 must be arranged away from the bus bar 101, adjustment work is difficult, which may have occurred problems such as measurement errors and lower measurement accuracy.

The present invention has hence been made in consideration of the above-described problem, and an object thereof is to provide a current sensor capable of saving the installation area and improving the measurement accuracy.

The foregoing object of the present invention is achieved by the following means. It is noted that reference signs in the embodiments to be described hereinafter are added in parentheses, but the present invention is not intended to be limited thereto.

In an embodiment, the invention can include:
a bus bar (2, 2A, 2B, 2C, 2D) through which a current (I) to be measured flows; and
a magnetic sensor (102) for detecting a magnetic field component (M) generated by the current (I) flowing through the bus bar (2, 2A, 2B, 2C, 2D), in which
the bus bar (2, 2A, 2B, 2C, 2D) is provided with a changer (left through-hole 2h1, right through-hole 2h2, upper notch 2hA1, lower notch 2hA2, upper notch 2hB1, lower notch 2hB2, upper notch 2hC1, lower notch 2hC2, upper protrusion 2hD1, lower protrusion 2hD2) that can change the flow of the current (I) to be measured,
the magnetic sensor (102) is mounted on an upper surface (2a) of the bus bar (2, 2A, 2B, 2C, 2D).

The changer can becomposed of at least one of the through-holes (left through-hole 2h1, right through-hole 2h2), recessed holes, notches (upper notch 2hA1, lower notch 2hA2, upper notch 2hB1, lower notch 2hB2, upper notch 2hC1, lower notch 2hC2), or protrusions (upper protrusion 2hD1, lower protrusion 2hD2).

When the magnetic sensor (102) is mounted on the upper surface (2a) of the bus bar (2, 2A, 2B, 2C, 2D), in a case where the changer is composed of the through-hole (left through-hole 2h1, right through-hole 2h2), the magnetic sensor (102) can be screw-fixed to the upper surface (2a) of the bus bar (2, 2A, 2B, 2C, 2D) using the through-hole (left through-hole 2h1, right through-hole 2h2).

Next will be described advantageous effects of the present invention with reference signs in the drawings. It is noted that reference signs in the embodiments to be described hereinafter are added in parentheses, but the present invention is not intended to be limited thereto.

According to the first aspect of the present invention, the bus bar (2, 2A, 2B, 2C, 2D) is provided with a changer (left through-hole 2h1, right through-hole 2h2, upper notch 2hA1, lower notch 2hA2, upper notch 2hB1, lower notch 2hB2, upper notch 2hC1, lower notch 2hC2, upper protrusion 2hD1, lower protrusion 2hD2) that can change the flow of the current (I) to be measured, so that variations of intensity of the magnetic field component (M) can be generated on the surface of the bus bar (2, 2A, 2B, 2C, 2D). This eliminates the need to adjust the magnetic sensor (102) in the vertical upward direction or the vertically downward direction with respect to the bus bar (2, 2A, 2B, 2C, 2D) as is conventional, thereby the installation area of the current sensor can be reduced.

Further, since the magnetic sensor (102) is mounted on the upper surface (2a) of the bus bar (2, 2A, 2B, 2C, 2D), it is not necessary to adjust the magnetic sensor (102) away from the bus bar (2, 2A, 2B, 2C, 2D). This facilitates the adjustment work and makes the measurement error less likely to occur, thus improves the measurement accuracy.

According to the present invention, the installation area of the current sensor can be reduced and the measurement accuracy can be improved.

The changer is preferably composed of at least one of the through-holes (left through-hole 2h1, right through-hole 2h2), recessed holes, notches (upper notch 2hA1, lower notch 2hA2, upper notch 2hB1, lower notch 2hB2, upper notch 2hC1, lower notch 2hC2), or protrusions (upper protrusion 2hD1, lower protrusion 2hD2). This can generate the variations of intensity of the magnetic field component (M) on the surface of the bus bar (2, 2A, 2B, 2C, 2D).

When the changer is composed of the through-hole (left through-hole 2h1, right through-hole 2h2), the through-hole can be made to be served as a changer of the flow of the current (I) to be measured and served as a screw fixing for the magnetic sensor (102) to the upper surface (2a) of the bus bar (2, 2A, 2B, 2C, 2D). This eliminates the need to make other holes with separate roles in the bus bar (2, 2A, 2B, 2C, 2D), thereby simplifying the manufacturing process of the current sensor.

BRIEF DESCRIPTION OF THE DRAWINGS

FIG. 3 (b) is a diagram showing a measurement result of a magnetic flux density generated when the FIG. 3 (a) is viewed from the side.

FIG. 4 (b) is a diagram showing a measurement result of a magnetic flux density generated when the FIG. 4(a) is viewed from the side.

FIG. 5 (b) is a perspective view of another variation of the bus bar.

FIG. 6 (b) is a diagram showing a measurement result of a magnetic flux density generated when the bus bar in FIG. 6 (a) is viewed from the side.

FIG. 8 (b) is a diagram showing a measurement result of a magnetic flux density generated when the bus bar in FIG. 8 (a) is viewed from the side.

DETAILED DESCRIPTION OF THE PREFERRED EMBODIMENTS

Hereinafter, an embodiment of a current sensor according to the present invention will be specifically described with reference to the drawings. It is noted that, in the following description, when vertical and horizontal directions are indicated, it shall mean vertical and horizontal directions when viewed from the front of the figure. Also, it should be noted that components identical to those as conventional are designated by the same reference signs to omit the description thereof.

Figure 1:
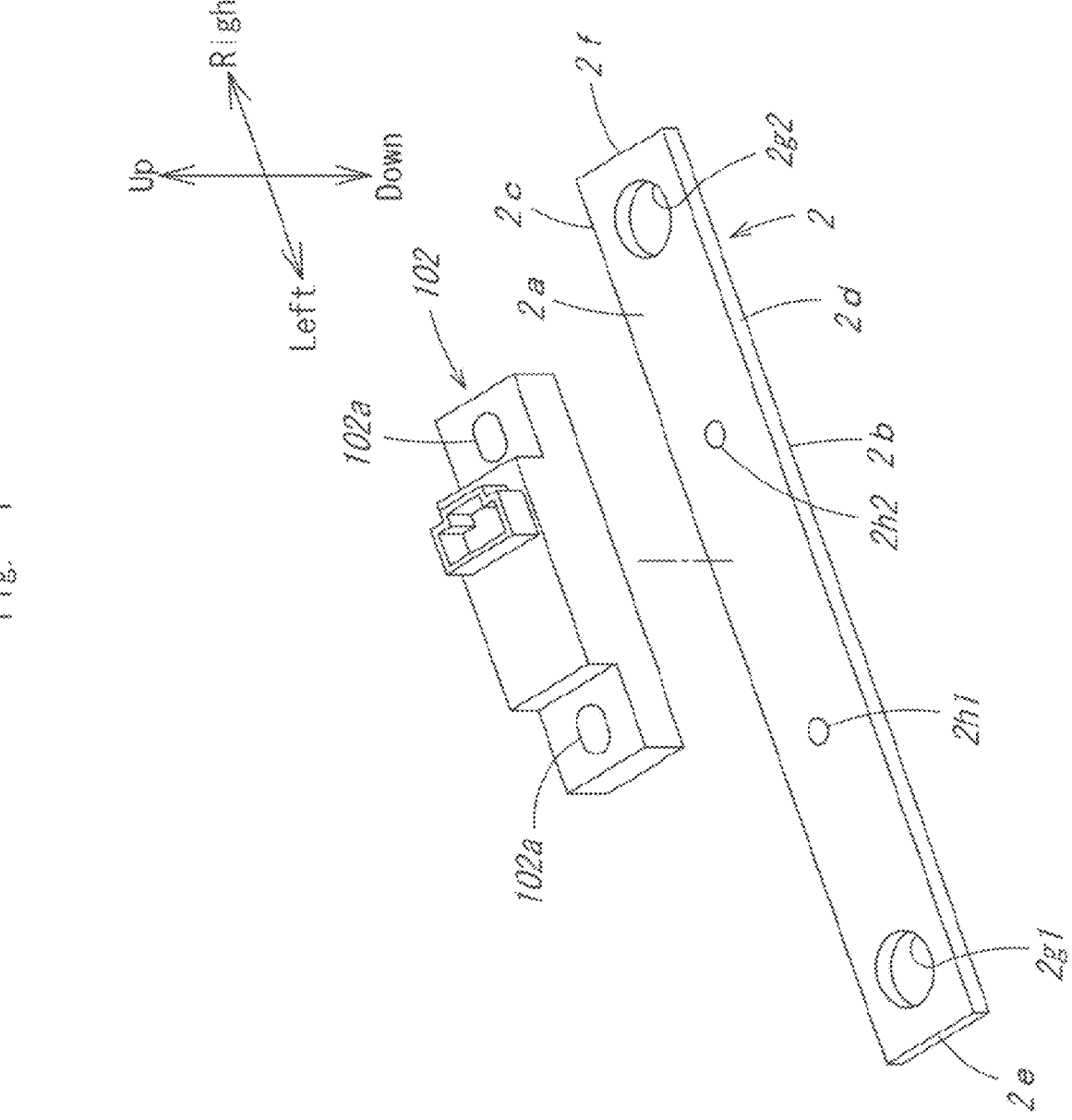
FIG. 1 is an exploded perspective view of a current sensor according to an embodiment of the present invention.

The current sensor according to the present embodiment is used in an in-vehicle inverter, an on-vehicle battery, or the like. As shown in FIG. 1, the current sensor 1 is composed of a bus bar 2 and a magnetic sensor 102.

The bus bar 2 is made of a metal such as a copper, and as shown in FIG. 1 for example, it is formed in a thick plate with a thickness of about 3 mm to 5 mm and is formed in a long rectangular shape having an upper surface 2a, a lower surface 2b, an upper side surface 2c, a lower side surface 2d, a left side surface 2e, and a right side surface 2f. At a side close to a left side surface 2e of the bus bar 2 a circular bolt hole 2g1 for passing a shaft part of a bolt (not shown) is formed so as to penetrate in a vertical direction, and also at a side close to a right side surface 2f of the bus bar 2 a circular bolt hole 2g2 for passing a shaft part of a bolt (not shown) is formed so as to penetrate in a vertical direction.

Furthermore, as shown in FIG. 1, at a center of the bus bar 2 slightly closer to the left side surface 2e, a left through-hole 2h1 to penetrate from the upper surface 2a toward the lower surface 2b is formed, and at the center of the bus bar 2 slightly closer to the right side surface 2f, a right through-hole 2h2 to penetrate from the upper surface 2a toward the lower surface 2b is formed.

Figure 3A:
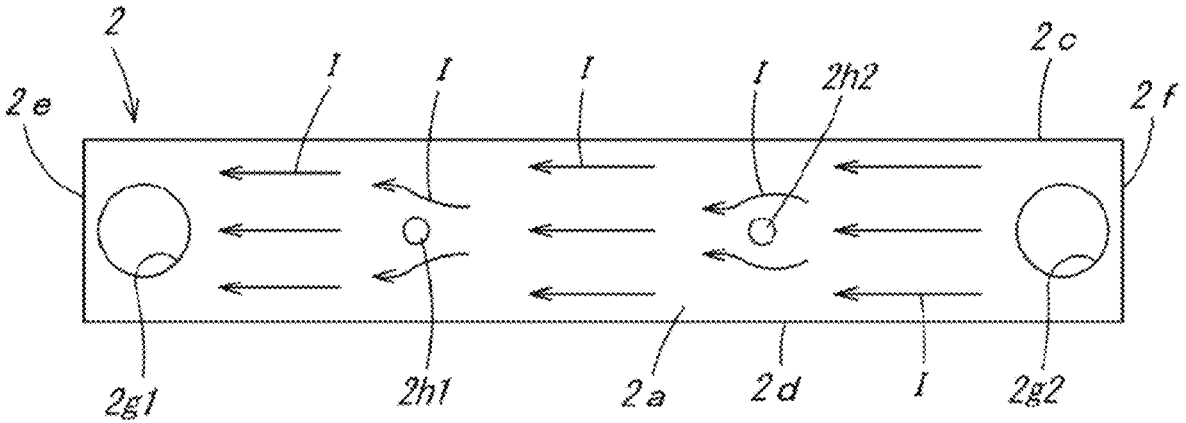
FIG. 3 (a) is a plan view of the bus bar according to the same embodiment explaining a state in which a current flows through the bus bar.
Figure 3B:
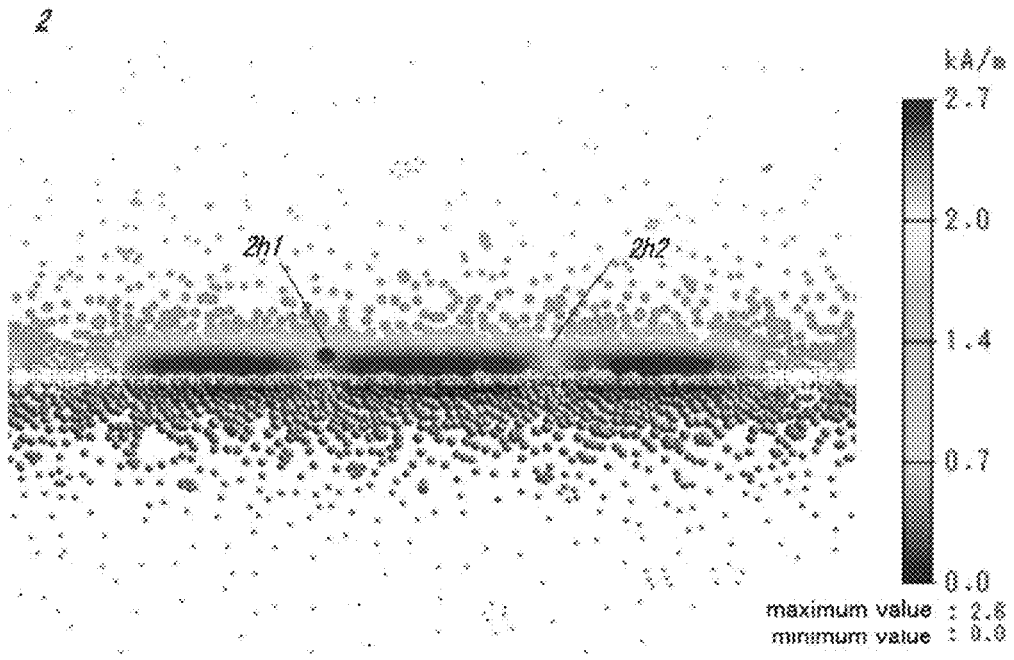
Figure 7:
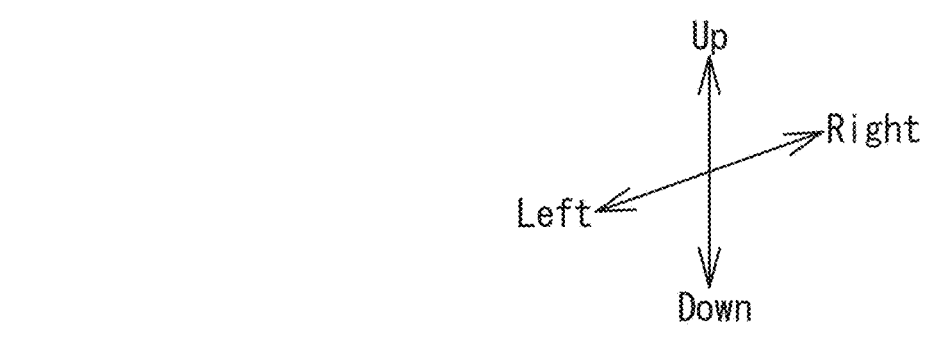
FIG. 7 is a perspective view of a conventional current sensor.
Figure 7:
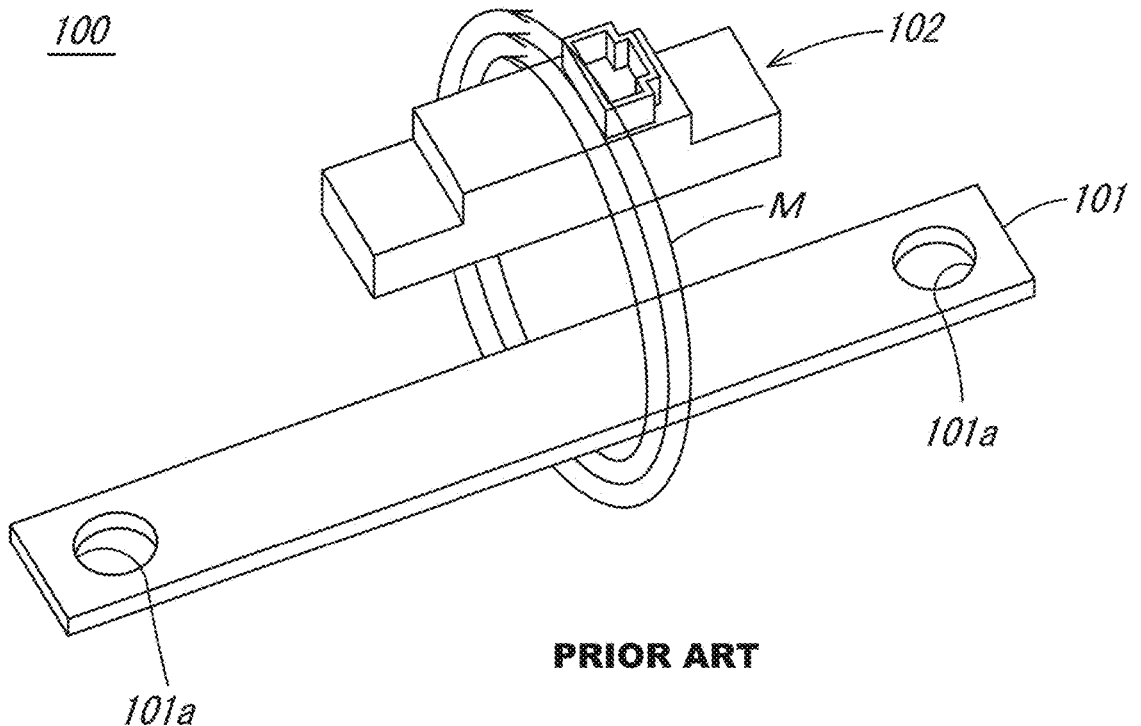
Figure 8A:
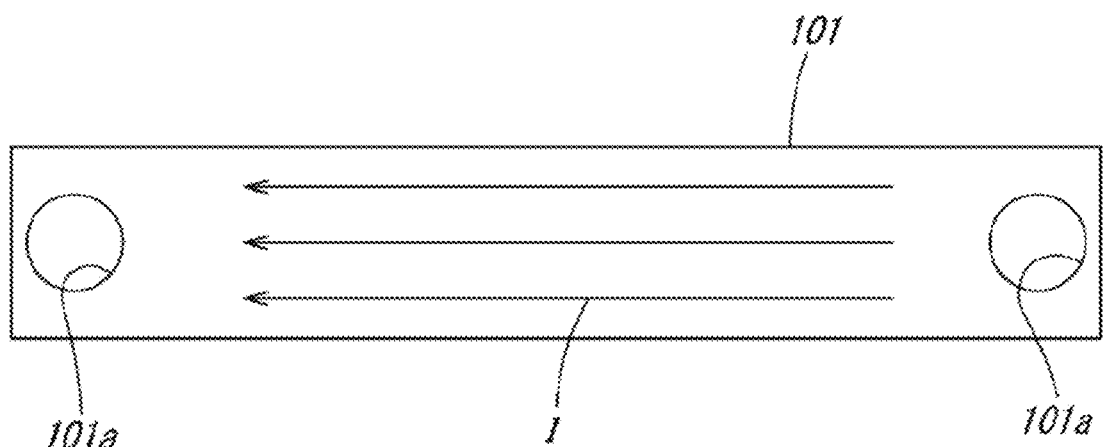
FIG. 8 (a) is a plan view of the conventional bus bar explaining a state in which a current flows through the bus bar.
Figure 8B:
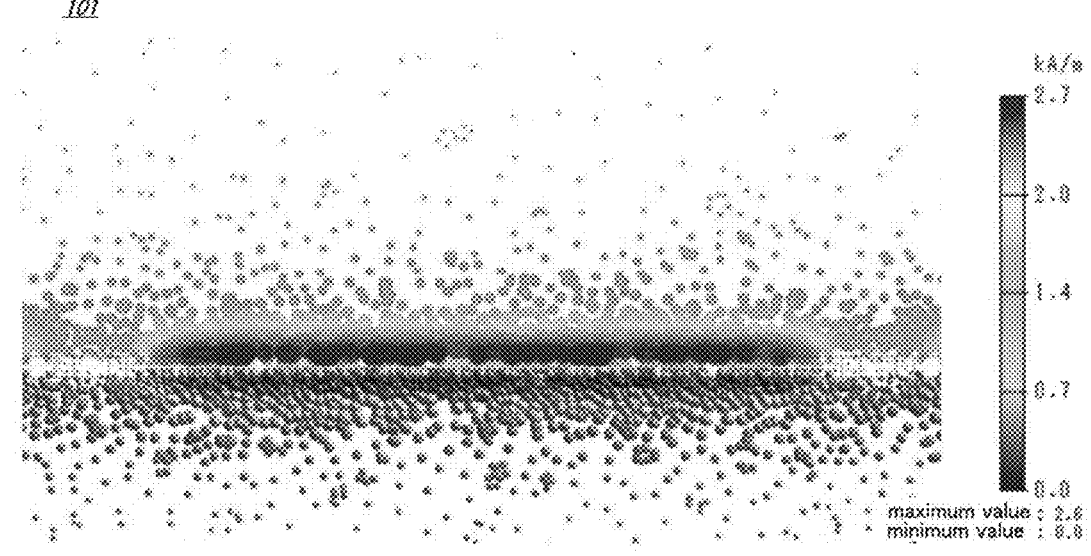

In the configuration such that the left through-hole 2h1 and the right through-hole 2h2 set forth above are formed in the bus bar 2, as shown in FIG. 3(a) when the current I to be measured linearly flows from the right side surface 2f to the left side surface 2e of the bus bar 2, the current I that was linearly flowing is curved so as to bypass the right through-hole 2h2, and further the current I linearly flowing is curved so as to bypass the left through-hole 2h1. Thereby the current path of the current I is made to be changed by the left through-hole 2h1 and the right through-hole 2h2. Therefore, when the current I to be measured flows linearly from the right side surface 2f to the left side surface 2e of the bus bar 2, a magnetic field component M (see FIG. 7) is generated in a direction perpendicular to the current I, while as will be apparent from a measurement result of a magnetic flux density shown in FIG. 3(b), a tense of the magnetic field component M in the vicinity of the left through-hole 2h1 and the right through-hole 2h2 clearly becomes weaker as compared to other points by the current I avoiding around the left through-hole 2h1 and the right through-hole 2h2. Accordingly, by forming the left through-hole 2h1 and the right through-hole 2h2 in the bus bar 2, the variation of intensity of the magnetic field component M can be generated on the surface of the bus bar 2.

Figure 2:
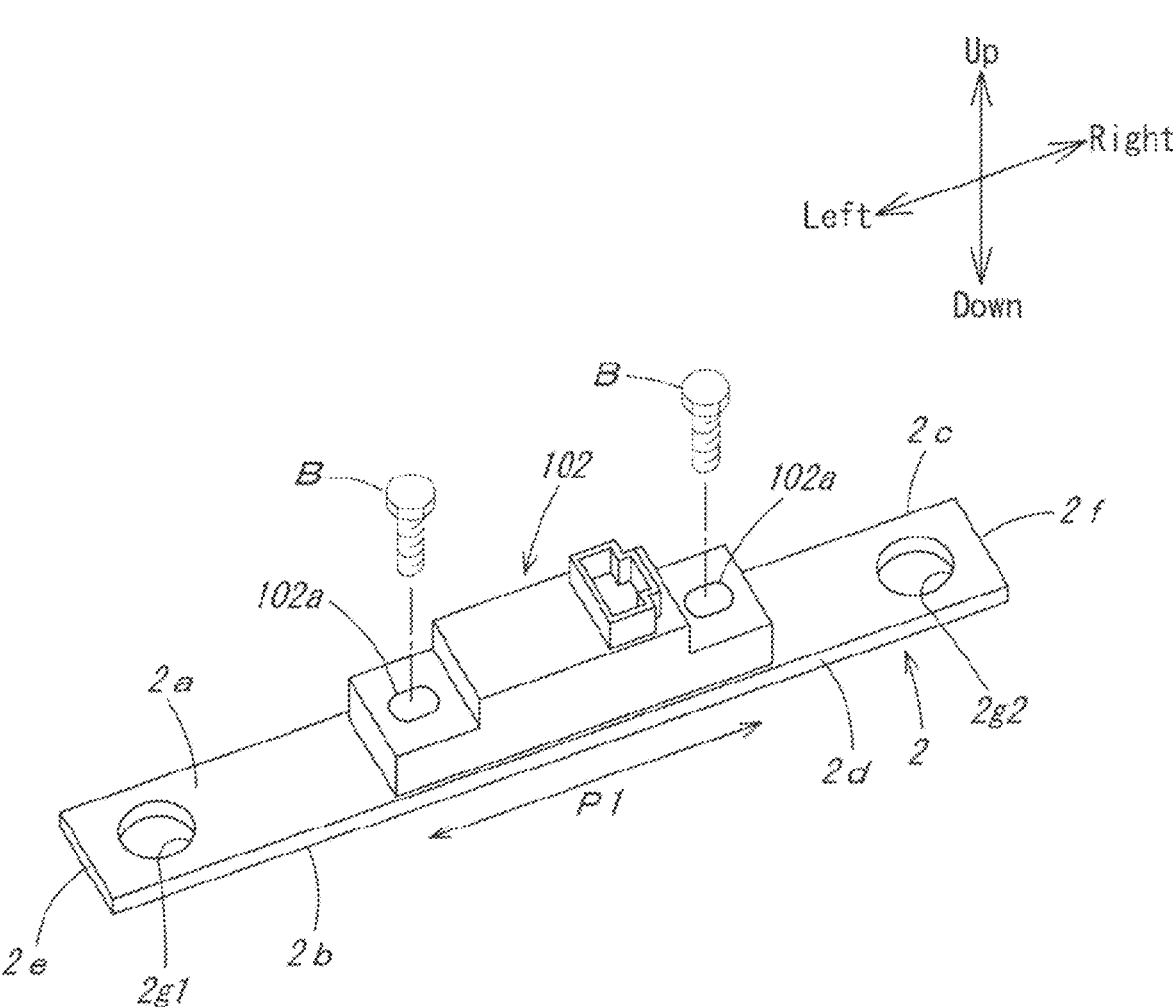
FIG. 2 is a perspective view of the current sensor according to the same embodiment.

Thus, since the variation of intensity of the magnetic field component M can be generated on the surface of the bus bar 2, in an order to adjust the sensitivity of the detection of the magnetic sensor 102, it is no longer needed to adjust the magnetic sensor 102 vertically upward or vertically downward with respect to the bus bar 2 as is conventional, and as shown in FIG. 2, the sensitivity of the detection of the magnetic sensor 102 can be adjusted only by moving the magnetic sensor 102 in the left-right direction (see arrow P1 shown in FIG. 2) in a state where the magnetic sensor 102 is mounted on the upper surface 2a of the bus bar 2. This eliminates the need to adjust the magnetic sensor 102 vertically upward or vertically downward with respect to the bus bar 2, and hence the installation area of the current sensor 1 can be reduced. Further, since the magnetic sensor 102 does not need to be adjusted away from the bus bar 2, the adjustment work is facilitated, and thus measurement errors are less likely to occur. Therefore, measurement accuracy can be improved.

After adjusting the sensitivity of the detection of the magnetic sensor 102, via elongated holes 102a provided in advance in the magnetic sensor 102 as shown in FIG. 2, the magnetic sensor 102 can be fixed to the upper surface 2a of the bus bar 2 by screws B shown in FIG. 2 into the left through-hole 2h1 and the right through-hole 2h2 shown in FIG. 1. Thus, when the left through-hole 2h1 and the right through-hole 2h2 are made to be served as a changer of the current path of the current I and served as a member for fixing the magnetic sensor 102 to the upper surface 2a of the bus bar 2 by screw, it will eliminate the need to provide other holes with separate roles in the bus bar 2, thereby simplifying the manufacturing process. In this case, the screw B is preferably made of plastic in which no current I flows so that the sensitivity of the detection of the adjusted magnetic sensor 102 is not deviated.

Thus, according to the present embodiment, the installation area of the current sensor can be reduced and the measurement accuracy can be improved.

Incidentally, the shape of the current sensor 1 shown in this embodiment is merely an example, and various modifications and changes are possible without departing from the spirit and scope of the present invention as defined in the appended claims. For example, this embodiment describes an example of screw fixing when the magnetic sensor 102 is fixed to the upper surface 2*a* of the bus bar 2 after adjusting the sensitivity of the detection of the magnetic sensor 102, but without being limited thereto, fixing by such as ultrasonic bonding, adhesive bonding may also be used. It is not necessary to provide the magnetic sensor 102 with an elongated hole 102*a* as shown in FIGS. 1 and 2 when the magnetic sensor 102 is fixed by such an ultrasonic bonding, adhesive bonding.

Further, this embodiment describes an example of forming the left through-hole 2*h*1 and the right through-hole 2*h*2 in the bus bar 2, but without being limited thereto, either one of the left through-hole 2*h*1 or the right through-hole 2*h*2 may be formed, or much more through-holes may be formed.

Further, this embodiment describes an example of forming the left through-hole 2*h*1 and the right through-hole 2*h*2 in the bus bar 2, but without being limited thereto, recessed hole that does not penetrate from the upper surface 2*a* to the lower surface 2*b* may be formed.

Figure 4A:
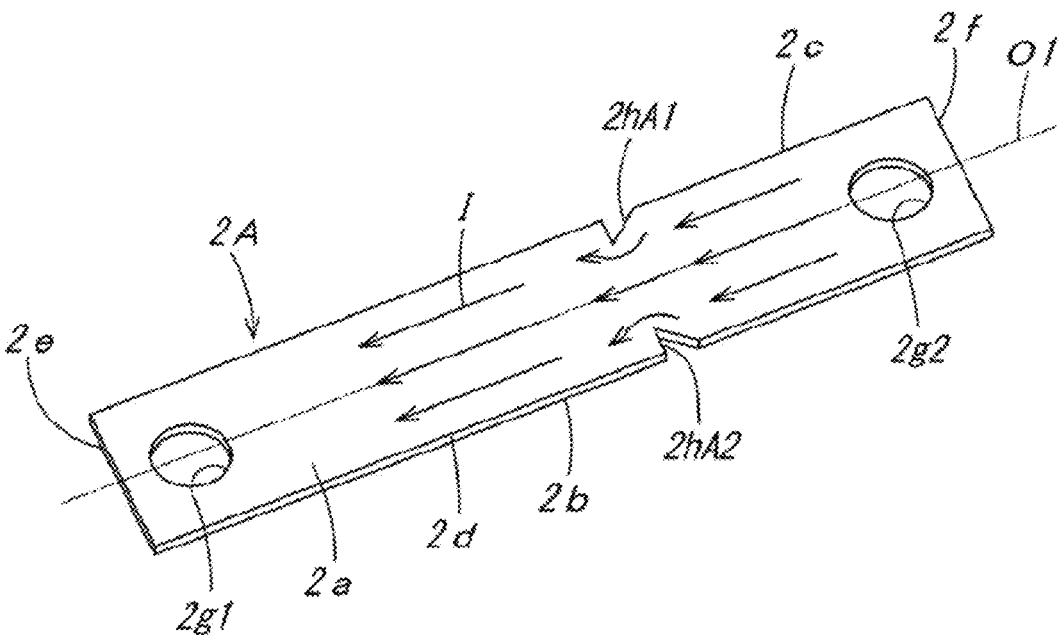
FIG. 4 (a) is a perspective view of a variation of the bus bar explaining a state in which a current flows through the bus bar.
Figure 4B:
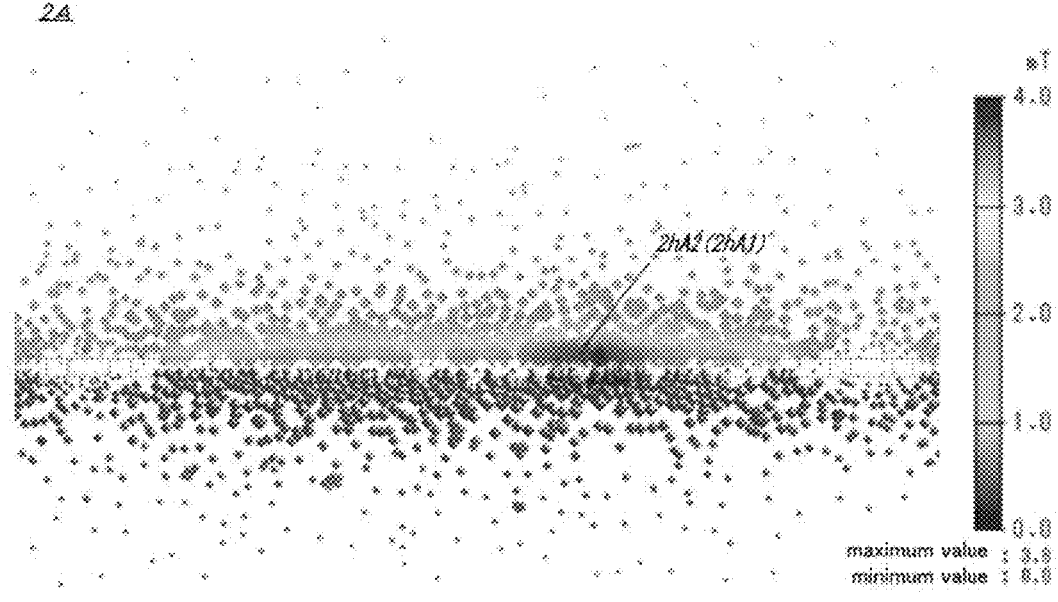

Further, this embodiment describes an example of forming the left through-hole 2*h*1 and the right through-hole 2*h*2 in the bus bar 2, but without being limited thereto, like a bus bar 2A as shown in FIG. 4(*a*) may also be used. This will next be described specifically with reference to FIG. 4. It should be noted that components identical to bus bar 2 described in FIGS. 1-3 are designated by the same reference signs to omit the description thereof.

On the bus bar 2A shown in FIG. 4(*a*), an upper notch 2*h*A1 and a lower notch 2*h*A2 are newly formed instead of the left through-hole 2*h*1 and the right through-hole 2*h*2 in the bus bar 2 shown in FIGS. 1-3. This upper notch portion 2*h*A1 is a cutout from the upper side surface 2*c* of the busbar 2 toward the center line O1 in a right-angled triangular shape, and the lower notch 2*h*A2 is a cut out from the lower side surface 2*d* of the bus bar 2 toward the center line O1 in a right-angled triangular shape. The upper notch 2*h*A1 and the lower notch 2*h*A2 are placed by a mirror-image with respect to the center line O1 as a base point.

In a configuration such that the upper notch 2*h*A1 and the lower notch 2*h*A2 set forth above are formed in the bus bar 2A, as shown in FIG. 4(*a*) when the current I to be measured flows linearly from the right side surface 2*f* of the bus bar 2 to the left side surface 2*e*, the current I that was linearly flowing avoids around the upper notch 2*h*A1 and flows into the center line O1 side of the bus bar 2A and the current I that was linearly flowing avoids around the lower notch 2*h*A2 and flows into the center line O1 side of the bus bar 2A. Thereby the current path of the current I is made to be changed by the upper notch 2*h*A1 and the lower notch 2*h*A2. Therefore, when the current I to be measured flows linearly from the right side surface 2*f* to the left side surface 2*e* of the bus bar 2A, a magnetic field component M (see FIG. 7) is generated in a direction perpendicular to the current I, while as will be apparent from a measurement result of the magnetic flux density shown in FIG. 4(*b*), by the concentration of the current I at the center line O1 side of the bus bar 2A a tense of the magnetic field component M in the vicinity where the upper notch 2*h*A1 and the lower notch 2*h*A2 are formed clearly becomes stronger as compared to other points. Accordingly, by forming the upper notch 2*h*A1 and the lower notch 2*h*A2 in the bus bar 2A, the variation of intensity of the magnetic field component M can be generated on the surface of the bus bar 2A.

Thus, in this way, the installation area of the current sensor can be reduced and the measurement accuracy can be improved.

Figure 5A:
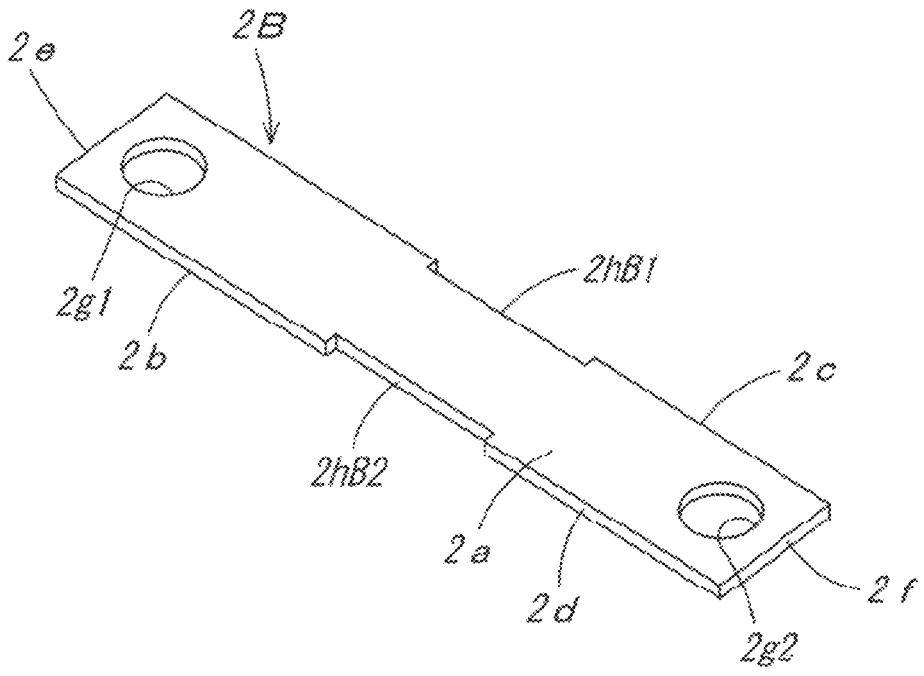
FIG. 5 (a) is a perspective view of a variation of the bus bar.
Figure 5B:
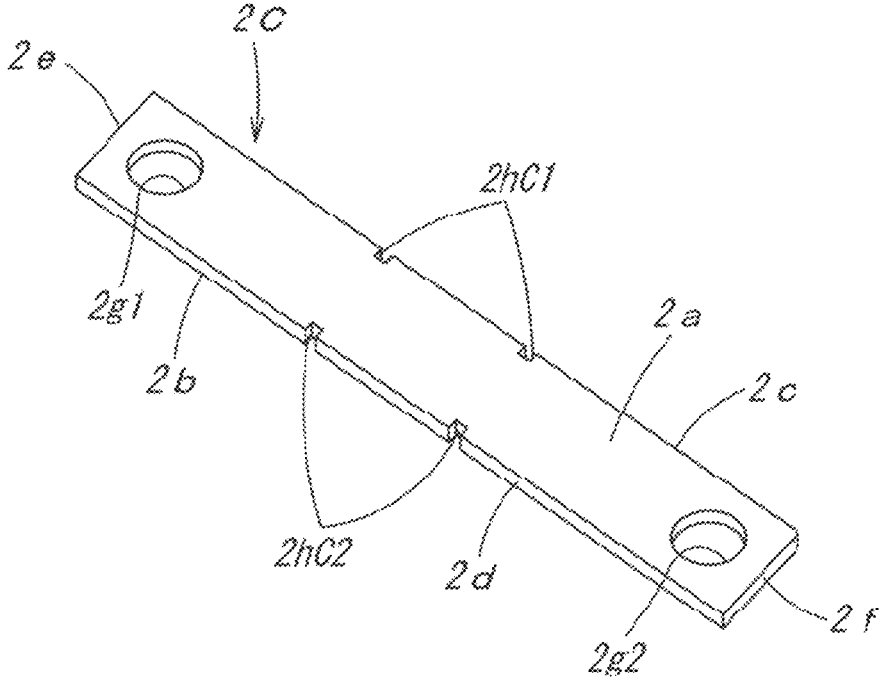

Incidentally, without being limited thereto, the upper notch 2*h*A1 and the lower notch 2*h*A2 shown in FIG. 4(*a*) may have any shapes. For example, an upper notch 2*h*B1 and a lower notch 2*h*B2 may be formed in a recessed shape like a bus bar 2B shown in FIG. 5(*a*). Further, like a bus bar 2C shown in FIG. 5(*b*), an upper notches 2*h*C1 and a lower notches 2*h*C2 may be formed in a recessed shape and set longitudinally (from the right side surface 2*f* to the left side surface 2*e* of the bus bar 2C) at predetermined intervals. (In FIG. 5(*a*), a pair of the upper notch 2*h*B1 and the lower notch 2*h*B2 is arranged)

Figure 6A:
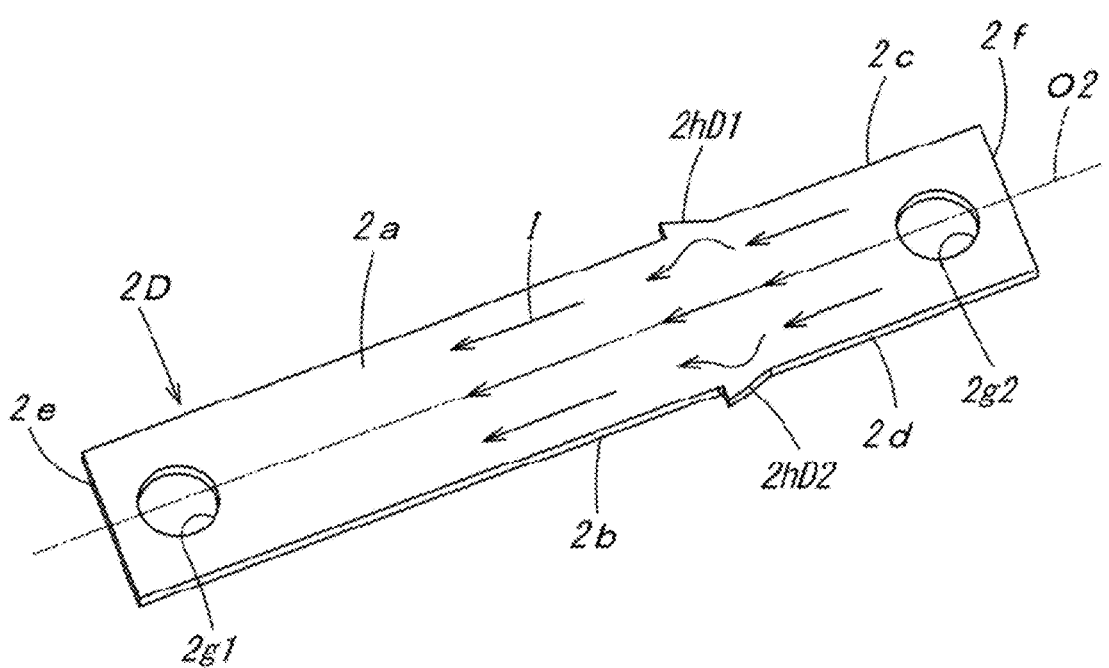
FIG. 6 (a) is a perspective view of a variation of a bus bar explaining a state in which a current flows through the bus bar.
Figure 6B:
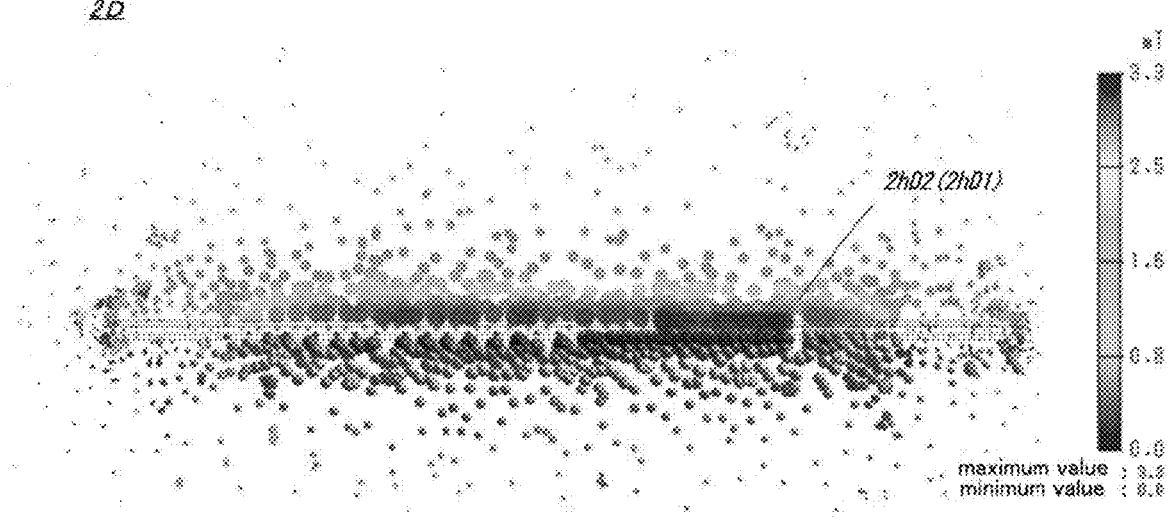

While, a bus bar 2D shown in FIG. 6(*a*) may also be used. This is specifically described with reference to FIG. 6. It should be noted that components identical to the bus bar 2 shown in FIGS. 1-3 are designated by the same reference signs to omit the description thereof.

A bus bar 2D shown in FIG. 6(*a*), an upper protrusion 2*h*D1 and a lower protrusion 2*h*D2 are newly formed instead of the left through-hole 2*h*1 and the right through-hole 2*h*2 in the bus bar 2 shown in FIGS. 1-3. This upper protrusion 2*h*D1 is protruding outwardly provided in a right triangular shape integrally formed from the upper side surface 2*c* of the bus bar 2D, and the lower protrusion 2*h*D2 is protruding outwardly provided in a right triangular shape integrally formed from the lower side surface 2*d* of the bus bar 2D. The upper protrusion 2*h*D1 and the lower protrusion 2*h*D2 are placed by a mirror-image with respect to the center line O2 as a base point.

In the configuration such that the upper protrusion 2*h*D1 and the lower protrusion 2*h*D2 are formed in the bus bar 2D set forth above, as shown in FIG. 6(*a*) when the current I to be measured flows linearly from the right side surface 2*f* to the left side surface 2*e* of the bus bar 2, the current I that was linearly flowing is curved by passing through the upper protrusion 2*h*D1, and also the current I that was flowing linearly is curved by passing through the lower protrusion 2*h*D2. Thereby the current path of the current I is made to be changed by the upper protrusion 2*h*D1 and the lower protrusion 2*h*D2. Therefore, when the current I to be measured flows linearly from the right side surface 2*f* to the left side surface 2*e* of the bus bar 2D, a magnetic field component M (see FIG. 7) is generated in a direction perpendicular to the current I, while as will be apparent from a measurement result of the magnetic flux density shown in FIG. 6(*b*), a tense of the magnetic field component M in the vicinity of the upper protrusion 2*h*D1 and the lower protrusion 2*h*D2 clearly becomes weaker as compared to other points by the current I passing through the upper protrusion 2*h*D1 and the lower protrusion 2*h*D2. Accordingly, by forming the upper protrusion 2*h*D1 and the lower protrusion 2*h*D2 in the bus bar 2D, the variation of intensity of the magnetic field component M can be generated on the surface of the bus bar 2D.

Even in this way, the installation area of the current sensor can be reduced and the measurement accuracy can be improved.

What is claimed is:

1. A current sensor comprising:

a bus bar operable to conduct a flow a current to be measured;

a magnetic sensor operable to detect a magnetic field component generated by current flowing through the bus bar;

the bus bar having a changer operable to change the flow of the current to be measured;

the bus bar being formed in a rectangular shape having an upper surface, a lower surface, an upper side surface, a lower side surface, a left side surface, and a right side surface;

the magnetic sensor being mounted on the upper surface of the bus bar;

the current flowing through the busbar flows from the right side surface to the left side surface, or from the left side surface to the right side surface;

the changer being composed of a protruding portion; and the protruding portion being integrally provided so as to protrude outwardly from the upper side surface and the lower side surface of the busbar, respectively.

* * * * *